(12) United States Patent
Minegishi et al.

(10) Patent No.: US 8,859,185 B2
(45) Date of Patent: *Oct. 14, 2014

(54) RESIST UNDERLAYER FILM-FORMING COMPOSITION

(71) Applicant: JSR Corporation, Tokyo (JP)

(72) Inventors: Shin-ya Minegishi, Tokyo (JP); Yushi Matsumura, Tokyo (JP); Shinya Nakafuji, Tokyo (JP); Kazuhiko Komura, Tokyo (JP); Takanori Nakano, Tokyo (JP); Satoru Murakami, Tokyo (JP); Kyoyu Yasuda, Tokyo (JP); Makoto Sugiura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/948,107

(22) Filed: Jul. 22, 2013

(65) Prior Publication Data

US 2013/0310514 A1    Nov. 21, 2013

Related U.S. Application Data

(62) Division of application No. 13/221,853, filed on Aug. 30, 2011, now Pat. No. 8,513,133.

(30) Foreign Application Priority Data

Mar. 31, 2011  (JP) .................... 2011-081332

(51) Int. Cl.
- *G03F 7/11* (2006.01)
- *G03F 7/025* (2006.01)
- *G03F 7/09* (2006.01)
- *C08G 8/08* (2006.01)
- *C08L 61/06* (2006.01)

(52) U.S. Cl.
CPC    *G03F 7/091* (2013.01); *C08G 8/08* (2013.01); *C08L 61/06* (2013.01); *G03F 7/094* (2013.01)
USPC ........ 430/271.1; 526/284; 525/502; 525/534; 525/480; 528/125; 528/152; 430/270.1

(58) Field of Classification Search
None
See application file for complete search history.

(56) References Cited

U.S. PATENT DOCUMENTS

| 5,385,804 A | 1/1995 | Premlatha et al. |
| 5,714,086 A * | 2/1998 | Osuna et al. ............. 252/182.18 |

(Continued)

FOREIGN PATENT DOCUMENTS

| JP | 2003-533502 | 11/2003 |
| JP | 2009-014816 | 1/2009 |
| WO | WO 2007/105776 | 9/2007 |

OTHER PUBLICATIONS

English translation of JP,2009-014816, A (2009) from machine translation from AIPN Japan Patent Office National Center for Industrial Property Information and Training, generated Feb. 26, 2014 30 pages using Chemistry, JIS, and Electronic engineering as dictionaries to aid in translation.*

Derwent-Acc-No. 2009-e13331 (English abstract of JP 2009-014816) three pages obtained from East database of USPTO.*

*Primary Examiner* — Cynthia Hamilton
(74) *Attorney, Agent, or Firm* — Oblon, Spivak, McClelland, Maier & Neustadt, L.L.P.

(57) ABSTRACT

A resist underlayer film-forming composition includes a polymer including a repeating unit shown by a formula (1), and having a polystyrene-reduced weight average molecular weight of 3000 to 10,000, and a solvent. Each of $R^3$ to $R^8$ individually represent a group shown by the following formula (2) or the like. $R^1$ represents a single bond or the like. $R^2$ represents a hydrogen atom or the like.

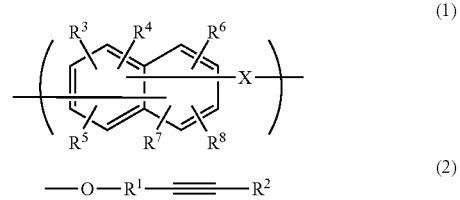

3 Claims, 1 Drawing Sheet

(56) References Cited

U.S. PATENT DOCUMENTS

| | | |
|---|---|---|
| 6,683,211 B1 | 1/2004 | Lamberth et al. |
| 7,632,624 B2 * | 12/2009 | Hatakeyama et al. ..... 430/271.1 |
| 7,749,681 B2 | 7/2010 | Yoshimura et al. |
| 7,943,285 B2 | 5/2011 | Endo et al. |
| 2008/0227038 A1 | 9/2008 | Endo et al. |
| 2009/0062430 A1 * | 3/2009 | Ikezawa et al. ............... 523/400 |
| 2009/0246645 A1 | 10/2009 | Nozawa |
| 2010/0119980 A1 * | 5/2010 | Rahman et al. ............... 430/313 |

* cited by examiner

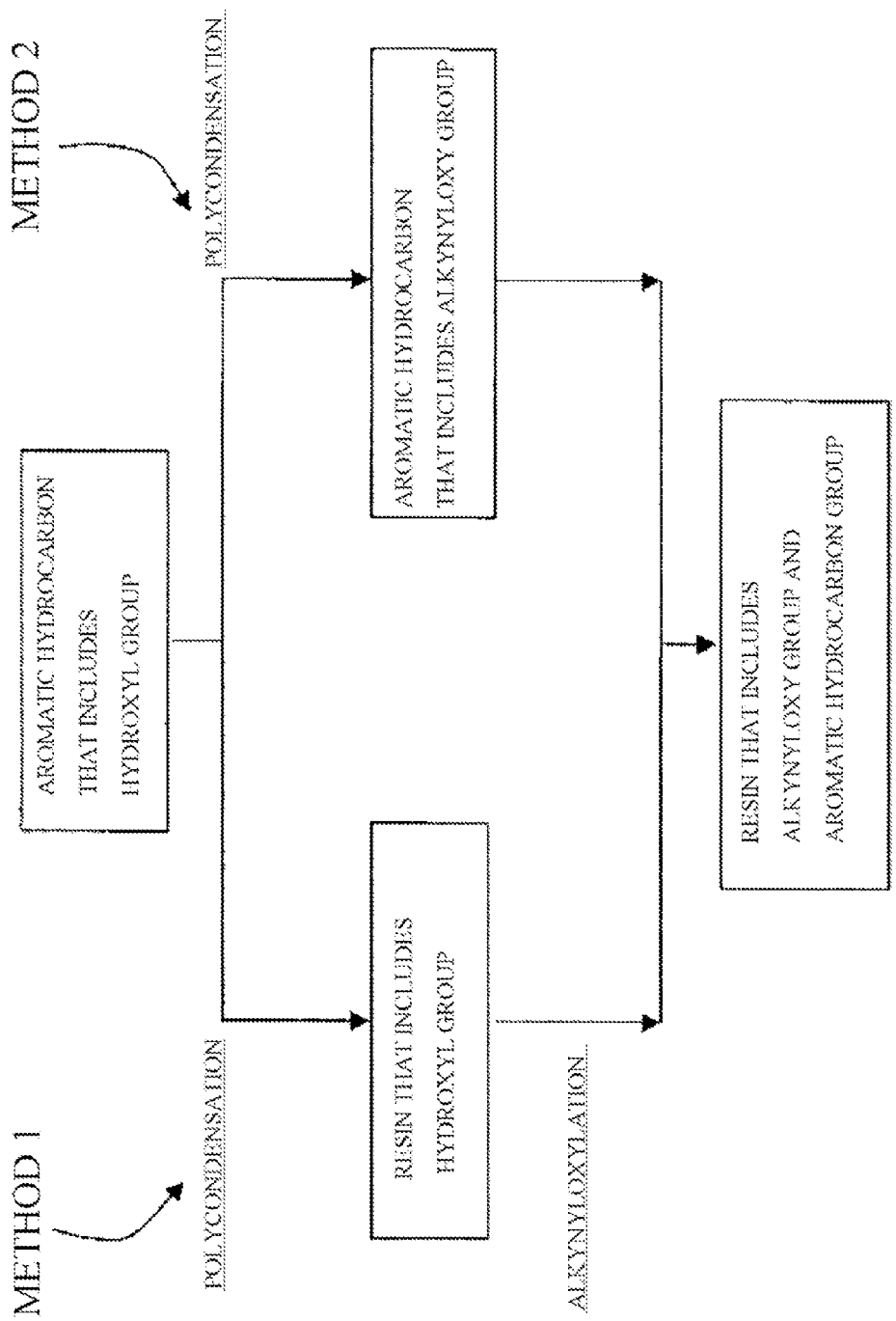

RESIST UNDERLAYER FILM-FORMING COMPOSITION

CROSS-REFERENCE TO RELATED APPLICATIONS

The present application is a divisional application of the U.S. patent application Ser. No. 13/221,853 filed Aug. 30, 2011, which claims priority under 35 U.S.C. §119 to Japanese Patent Application No. 2011-81332, filed Mar. 31, 2011. The contents of this application are incorporated herein by reference in their entirety.

BACKGROUND OF THE INVENTION

1. Field of the Invention

The invention relates to a resist underlayer film-forming composition.

2. Discussion of the Background

A semiconductor device production process normally includes depositing a plurality of materials (processing target film) on a silicon wafer, and patterning the processing target film to form a desired pattern. When patterning the processing target film, a photosensitive material (resist) is deposited on the processing target film to form a resist film, and a given area of the resist film is exposed. The exposed area or the unexposed area of the resist film is removed by development to form a resist pattern, and the processing target film is dry-etched using the resist pattern as an etching mask.

Such a process utilizes ultraviolet rays (e.g., ArF excimer laser light) as the exposure light source for exposing the resist film. A reduction in line width of large-scale integrated circuits (LSI) has been increasingly desired, and a resolution equal to or shorter than the exposure wavelength may be required.

A process has been studied that forms a resist underlayer film (hereinafter may be referred to as "underlayer film") on the processing target film, transfers the resist pattern to the underlayer film to form an underlayer film pattern, and transfers the resist pattern to the processing target film using the underlayer film pattern as an etching mask (hereinafter may be referred to as "multilayer resist process"). When using the multilayer resist process, it is desirable that the underlayer film be formed of a material that exhibits etching resistance. For example, a composition that contains a polymer that has a side-chain alkynyloxy group has been proposed as a material for forming such an underlayer film (see Japanese Patent Application Publication (KOKAI) No. 2009-014816).

It is necessary to embed depressions formed in a topological substrate when forming a pattern using lithography. In this case, an underlayer film material may be applied, and the resulting film may be planarized.

When forming a flat film on a topological substrate, it is necessary to increase the fluidity of the composition used to form the film. Therefore, it is desirable that the polymer included in the composition have a low molecular weight.

SUMMARY OF THE INVENTION

According to one aspect of the invention, a resist underlayer film-forming composition includes a polymer including a repeating unit shown by a formula (1), and having a polystyrene-reduced weight average molecular weight of 3000 to 10,000, and (B) a solvent.

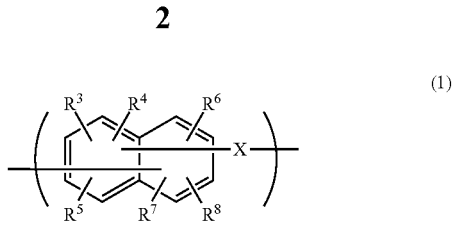

(1)

Each of $R^3$ to $R^8$ individually represent a group shown by a formula (2), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 2 to 6 carbon atoms. At least one of $R^3$ to $R^8$ represents the group shown by the formula (2). X represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arylene group having 6 to 14 carbon atoms, or a divalent group formed by an arbitrary combination thereof.

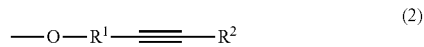

(2)

$R^1$ represents a single bond, a substituted or unsubstituted alkanediyl group having 1 to 20 carbon atoms, or a substituted or unsubstituted arylene group having 6 to 20 carbon atoms. $R^2$ represents a hydrogen atom, a substituted or unsubstituted alkyl group having 1 to 20 carbon atoms, or a substituted or unsubstituted aryl group having 6 to 20 carbon atoms.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawing.

FIG. 1 is a flowchart showing a method of producing a polymer included in a resist underlayer film-forming composition according to one embodiment of the invention.

DESCRIPTION OF THE EMBODIMENTS

Embodiments of the invention are described below.

[1] A resist underlayer film-forming composition including (A) a polymer that includes a repeating unit shown by the following formula (1), and has a polystyrene-reduced weight average molecular weight of 3000 to 10,000, and (B) a solvent,

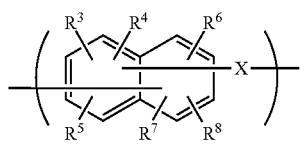

(1)

wherein $R^3$ to $R^8$ individually represent a group shown by the following formula (2) (hereinafter may be referred to as "specific substituent (S1)"), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 2 to 6 carbon atoms, provided that at least one of $R^3$ to $R^8$ represents the group shown by the formula (2), and X represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arylene group having 6 to 14 carbon atoms, or a divalent group formed by combining arbitrary groups among these groups,

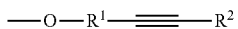

(2)

wherein $R^1$ represents a single bond, a substituted or unsubstituted alkanediyl group having 1 to 20 carbon atoms, or a substituted or unsubstituted arylene group having 6 to 20 carbon atoms, and $R^2$ represents a hydrogen atom, a substituted or unsubstituted alkyl group having 1 to 20 carbon atoms, or a substituted or unsubstituted aryl group having 6 to 20 carbon atoms.

[2] The resist underlayer film-forming composition according to [1], wherein the polymer (A) has a dispersity of 1.4 to 5.0.

[3] The resist underlayer film-forming composition according to [1] or [2], further including (C) an acid generator.

[4] The resist underlayer film-forming composition according to any one of [1] to [3], further including (D) a crosslinking agent.

[5] A method for forming a pattern including (1) a step of applying the resist underlayer film-forming composition according to any one of [1] to [4] to a substrate to form a resist underlayer film, (2) a step of applying a resist composition to the substrate to form a resist film, (3) a step of exposing the resist film by selectively applying radiation to the resist film via a photomask, (4) a step of developing the exposed resist film to form a resist pattern, and (5) a step of dry-etching the resist underlayer film and the substrate using the resist pattern as a mask to form a pattern.

The resist underlayer film-forming composition according to the above embodiment of the invention can form a resist underlayer film that exhibits excellent etching resistance as compared with a related-art resist underlayer film, can fill depressions formed in a substrate therewith to produce a flat resist underlayer film, and can reduce the amount of outgas released when forming a resist underlayer film. Therefore, it is expected that the resist underlayer film-forming composition improves the yield of microfabrication using a lithographic process (particularly production of integrated circuit devices).

The embodiments will now be described with reference to the accompanying drawing. Note that the invention is not limited to the following embodiments. It should be understood that various modifications and improvements may be made of the following embodiments without departing from the scope of the invention based on common knowledge of a person skilled in the art.

The term "substituent" used herein is not particularly limited. Examples of a group that is included in the term "substituent" used herein include —$R^{S1}$, —$R^{S2}$—O—$R^{S1}$, —$R^{S2}$—CO—$R^{S1}$, —$R^{S2}$—O—CO—$R^{S1}$, —$R^{S2}$—OH, and —$R^{S2}$—CN (wherein $R^{S1}$ represents an alkyl group having 1 to 10 carbon atoms, a cycloalkyl group having 3 to 20 carbon atoms, or an aryl group having 6 to 30 carbon atoms, provided that some or all of the hydrogen atoms of these groups may be substituted with a fluorine atom, and $R^{S2}$ represents an alkanediyl group having 1 to 10 carbon atoms, a cycloalkanediyl group having 3 to 20 carbon atoms, an arylene group having 6 to 30 carbon atoms, a group obtained by substituting some or all of the hydrogen atoms of these groups with a fluorine atom, or a single bond).

The expression "substituted with a substituent" used herein means that a group is substituted with one or more of one type of substituent, or substituted with one or more of each of a plurality of types of substituent.

1. Resist Underlayer Film-Forming Composition

A resist underlayer film-forming composition according to one embodiment of the invention is described below. The resist underlayer film-forming composition according to one embodiment of the invention includes (A) a polymer that includes a repeating unit shown by the formula (1), and has a polystyrene-reduced weight average molecular weight (hereinafter may be referred to as "Mw") of 3000 to 10,000 (hereinafter may be referred to as "polymer (A)"), and (B) a solvent.

[1] Polymer (A)

The polymer (A) according to one embodiment of the invention includes a structural unit shown by the formula (1) (hereinafter may be referred to as "structural unit (a)").

[Structural Unit (a)]

X in the formula (1) represents an alkanediyl group having 1 to 10 carbon atoms, a cycloalkanediyl group having 3 to 20 carbon atoms, an alkanediyloxy group having 1 to 10 carbon atoms, a cycloalkanediyloxy group having 3 to 20 carbon atoms, an arylene group having 6 to 14 carbon atoms, or a divalent group formed by combining arbitrary groups among these groups, provided that these groups may be substituted with a substituent.

Examples of the alkanediyl group include chain-like saturated hydrocarbon groups such as a methanediyl group, an ethanediyl group, a propanediyl group, a butanediyl group, a pentanediyl group, a hexanediyl group, an octanediyl group, a decanediyl group, an undecanediyl group, a hexadecanediyl group, and an icosanediyl group, and the like. Among these, a methylene group and an ethylene group are preferable.

Examples of a preferable substituent for the alkanediyl group include a furanyl group.

Examples of the cycloalkanediyl group include monocyclic saturated hydrocarbon groups such as a cyclopropanediyl group, a cyclobutanediyl group, a cyclopentanediyl group, a cyclohexanediyl group, a cycloheptanediyl group, a cyclooctanediyl group, a cyclodecanediyl group, a methylcyclohexanediyl group, and an ethylcyclohexanediyl group; polycyclic saturated hydrocarbon groups such as a bicyclo[2.2.1]

heptanediyl group, a bicyclo[2.2.2]octanediyl group, a tricyclo[5.2.1.0²,⁶]decanediyl group, a tricyclo[3.3.1.1³,⁷]decanediyl group, a tetracyclo[6.2.1.1³,⁶.0²,⁷]dodecanediyl group, and an adamantanediyl group; and the like.

Among these, a tricyclo[5.2.1.0²,⁶]decanediyl group (dicyclopentylene group) is preferable.

The arylene group is preferably a substituted or unsubstituted arylene group having 6 to 14 carbon atoms, such as a phenylene group or a naphthylene group.

Examples of the alkanediyloxy group include groups formed by combining an alkanediyl group and an oxygen atom. Examples of the cycloalkanediyloxy group include groups formed by combining a cycloalkanediyl group and an oxygen atom.

Examples of the divalent group formed by combining arbitrary groups among the above groups include a divalent group formed by combining an alkanediyl group and a cycloalkanediyl group, a divalent group formed by combining an alkanediyl group and an arylene group, and the like.

Specific examples of the group represented by X include the groups shown by the following formulas.

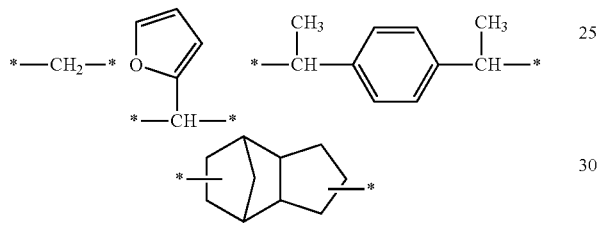

wherein "*" indicates a bonding hand.

Specific Substituent (S1)

The polymer (A) according to one embodiment of the invention includes the group shown by the formula (2).

Examples of the group shown by the formula (2) include alkynyloxy groups such as an ethynyloxy group, a (prop-1-yn-1-yl)oxy group, a (prop-2-yn-1-yl)oxy group, a (but-1-yn-1-yl)oxy group, a (but-3-yn-1-yl)oxy group, a (1-methylprop-2-yn-1-yl)oxy group, a (pent-1-yn-1-yl)oxy group, a (pent-4-yn-1-yl)oxy group, a (hex-1-yn-1-yl)oxy group, a (hex-5-yn-1-yl)oxy group, a (hept-1-yn-1-yl)oxy group, a (hept-6-yn-1-yl)oxy group, an (oct-1-yn-1-yl)oxy group, an (oct-7-yn-1-yl)oxy group, a (non-1-yn-1-yl)oxy group, a (non-8-yn-1-yl)oxy group, a (dec-1-yn-1-yl)oxy group, a (dec-9-yn-1-yl)oxy group, an (undec-1-yn-1-yl)oxy group, an (undec-10-yn-1-yl)oxy group, a (dodec-1-yn-1-yl)oxy group, a (dodec-11-yn-1-yl)oxy group, a (tridec-1-yn-1-yl)oxy group, a (tridec-12-yn-1-yl)oxy group, a (tetradec-1-yn-1-yl)oxy group, a (tetradec-13-yn-1-yl)oxy group, a (pentadec-1-yn-1-yl)oxy group, a (pentadec-14-yn-1-yl)oxy group, a (hexadec-1-yn-1-yl)oxy group, a (hexadec-15-yn-1-yl)oxy group, a (heptadec-1-yn-1-yl)oxy group, and a (heptadec-16-yn-1-yl)oxy group.

Among these, a (prop-2-yn-1-yl)oxy group is preferable.

Example of a preferable structural unit (a) include the structural units shown by the following formulas.

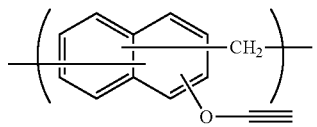

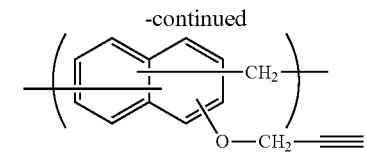

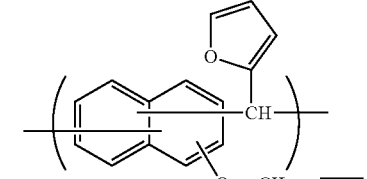

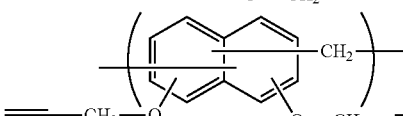

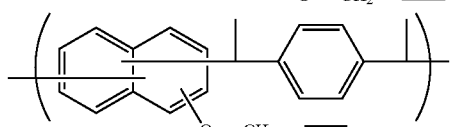

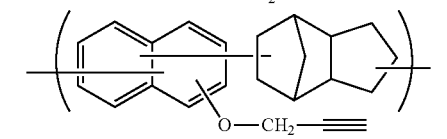

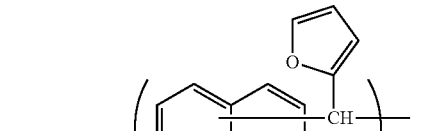

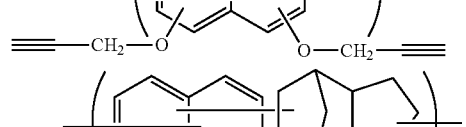

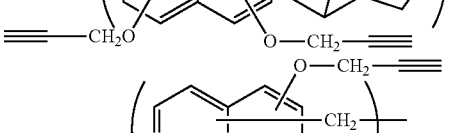

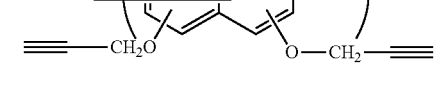

Mw

When the polymer (A) has a low Mw, the amount of sublimates tends to increase due to an increase in the content of low-molecular-weight components in the composition. When the polymer (A) has a high Mw, the filling capability tends to deteriorate since the composition loses fluidity. The Mw of the polymer (A) according to one embodiment of the invention is adjusted to 3000 to 10,000, and preferably 3000 to 5000, taking account of the above phenomena. If the Mw of the polymer (A) is within the above range, a resist underlayer film-forming composition that does not sublime when forming a resist underlayer film, and exhibits an excellent filling capability can be obtained. Note that the Mw of the polymer (A) may be controlled by adjusting the amount of condensation agent and the reaction time when producing the polymer (A) (described later).

Dispersity

The filling capability tends to decrease as the dispersity (Mw/Mn; "Mn" refers to polystyrene-reduced number average molecular weight determined by GPC) of the polymer (A) decreases (i.e., approaches 1). It is conjectured that this is because the space between the aggregates of the polymer is not sufficiently filled up as the dispersity decreases. The amount of sublimates tends to increase when forming a resist underlayer film as the dispersity increases. It is conjectured that this is because the content of low-molecular-weight components in the composition increases as the dispersity increases. The dispersity of the polymer (A) according to one embodiment of the invention is preferably adjusted to 1.4 to 5.0 taking account of the above phenomena. If the dispersity of the polymer (A) is within the above range, sublimation that may occur when forming a resist underlayer film can be more effectively suppressed, so that the filling capability can be further improved. Note that the dispersity of the polymer (A) may be controlled by adjusting the dropwise addition rate of a condensation agent when producing the polymer (A) (described below).

Method of Producing Polymer (A)

The polymer (A) according to one embodiment of the invention may be obtained by one of the two methods shown in FIG. 1. Specifically, a naphthalene compound that includes a hydroxyl group (hereinafter may be referred to as "compound (N1)") is polymerized, or polycondensed with an appropriate condensation agent (aldehyde, ketone, or divinyl compound) to obtain a naphthalene ring-containing polymer that includes a hydroxyl group (hereinafter may be referred to as "polymer (P1)"), and the polymer (P1) is alkynyloxyated using a compound that includes a leaving group corresponding to the alkynyloxy group (hereinafter may be referred to as "alkynylation agent") to obtain the polymer (A) (method 1).

Alternatively, a naphthalene compound that includes an alkynyloxy group obtained by reacting the compound (N1) with the alkynylation agent (hereinafter may be referred to as "compound (N2)") is polymerized, or polycondensed with an appropriate condensation agent (aldehyde, ketone, or divinyl compound) to obtain the polymer (A) (method 2).

Method (1)

The method 1 includes subjecting the compound (N1) to radical polymerization, cationic polymerization, anionic polymerization, or polycondensation with the condensation agent (e.g., aldehyde, ketone, or divinyl compound) to obtain a polymer that includes a hydroxyl group, and alkynyloxyating the polymer that includes a hydroxyl group using a compound that includes the group shown by the formula (2) (hereinafter may be referred to as "alkynylation agent").

Compound (N1)

Examples of the compound (N1) include naphthols such as 1-naphthol, 2-naphthol, 2-methyl-1-naphthol, 4-methoxy-1-naphthol, 7-methoxy-2-naphthol, 1,5-dihydroxynaphthalene, 1,7-dihydroxynaphthalene, 2,3-dihydroxynaphthalene, 2,6-dihydroxynaphthalene, 2,7-dihydroxynaphthalene, and binaphthol.

Among these, naphthols such as 1-naphthol, 4-methoxy-1-naphthol, 7-methoxy-2-naphthol, 1,5-dihydroxynaphthalene, 1,7-dihydroxynaphthalene, 2,3-dihydroxynaphthalene, and 2,7-dihydroxynaphthalene are preferable.

Examples of the aldehyde that may be used as the condensation agent include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, and the like.

Examples of the ketone that may be used as the condensation agent include acetone, methyl ethyl ketone, methyl isobutyl ketone, and the like. Examples of the divinyl compound that may be used as the condensation agent include divinylbenzene, dicyclopentadiene, tetrahydroindene, 4-vinylcyclohexene, 5-vinylnorborn-2-ene, α-pinene, β-pinene, limonene, 5-vinylnorbornadiene, and the like.

Among these, formaldehyde and furfural are preferable.

When using an aldehyde as the condensation agent, the aldehyde is preferably used in an amount of 1 to 1000 parts by mass, and more preferably 10 to 100 parts by mass, based on 100 parts by mass of an aromatic hydrocarbon.

The compound (N1) may be subjected to polycondensation with the condensation agent in the presence of an acidic catalyst. Examples of the acidic catalyst include mineral acids such as sulfuric acid, phosphoric acid, and perchloric acid; organic sulfonic acids such as p-toluenesulfonic acid; and carboxylic acids such as formic acid and oxalic acid. The acidic catalyst may be used in an appropriate amount depending on the type of acid. The acidic catalyst is preferably used in an amount of 0.001 to 100 parts by mass, and more preferably 0.01 to 10 parts by mass, based on 100 parts by mass of an aromatic hydrocarbon. The reaction (polycondensation) temperature is preferably 20 to 200° C. The reaction time may be appropriately determined depending on the reaction temperature, but is preferably 20 minutes to 72 hours.

Alkynylation Agent

Specific examples of the alkynylation agent include a compound shown by the following general formula (3).

$$Y—R^1—\!\!\!\equiv\!\!\!—R^2 \qquad (3)$$

wherein $R^1$ and $R^2$ are the same as defined for the formula (1), and Y represents a leaving group.

Specific examples of the leaving group represented by Y include a chloro group, a bromo group, a tosyl group, a mesyl group, a trifluoromethylsulfonyl group, and the like.

Alkynyloxylation

The polymer may be alkynyloxylated by an appropriate synthesis method (e.g., Japanese Patent Application Publication (TOKUHYO) No. 2003-533502). Specifically, a solution of the polymer (P1) may be reacted with the alkynylation agent in the presence of a basic compound.

Examples of the solvent used to prepare a solution of the polymer (P1) include methyl isobutyl ketone, tetrahydrofuran, and the like.

Examples of the basic compound include amines, metal hydroxides, metal carbonates, metal alkoxides, and the like. Among these, amines and metal hydroxides are preferable. Examples of the amines include triethylamine, N,N-diisopropylethylamine, pyridine, N-methylpiperidine, N-methylmorpholine, and the like. Examples of the metal hydroxides include sodium hydroxide and the like.

Method (2)

The method 2 includes reacting the compound (N1) with the alkynylation agent to obtain the compound (N2), and polycondensing the compound (N2).

The alkynylation agent used in the method 2 may be the same as that used in the method 1. The compound (N2) may be polycondensed in the same manner as in the method 1.

The polycondensation reaction may be implemented by condensing an aromatic compound or an alkynyloxylated aromatic compound with the condensation agent (e.g., aldehyde, ketone, or divinyl compound) in the presence of an acidic catalyst.

Examples of the acidic catalyst (acid catalyst) used for polycondensation include mineral acids such as sulfuric acid, phosphoric acid, and perchloric acid; organic sulfonic acids such as p-toluenesulfonic acid; and carboxylic acids such as formic acid and oxalic acid. The acidic catalyst may be used in an appropriate amount depending on the type of acid. The acidic catalyst is normally used in an amount of 0.001 to 100 parts by mass, and more preferably 0.01 to 10 parts by mass, based on 100 parts by mass of an aromatic hydrocarbon that includes a hydroxyl group.

The reaction (condensation) temperature is normally 20 to 200° C. The reaction time is appropriately determined depending on the reaction temperature, but is normally 20 minutes to 72 hours. The polystyrene-reduced weight average molecular weight (Mw) of the aromatic-containing polymer that includes a hydroxyl group thus obtained, determined by gel permeation chromatography (GPC), is preferably 2500 or more, and more preferably 3000 or more. The Mw of the polymer is preferably 12,000 or less, and more preferably 10,000 or less.

Solvent (B)

The resist underlayer film-forming composition according to one embodiment of the invention includes the solvent (B). The solvent (B) can dissolve the polymer (A) therein. Examples of the solvent (B) include ethylene glycol monoalkyl ethers such as ethylene glycol monomethyl ether, ethylene glycol monoethyl ether, ethylene glycol mono-n-propyl ether, and ethylene glycol mono-n-butyl ether; ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; diethylene glycol dialkyl ethers such as diethylene glycol dimethyl ether, diethylene glycol diethyl ether, diethylene glycol di-n-propyl ether, and diethylene glycol di-n-butyl ether; triethylene glycol dialkyl ethers such as trienthylene glycol dimethyl ether and triethylene glycol diethyl ether;

propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

lactates such as methyl lactate, ethyl lactate, n-propyl lactate, i-propyl lactate, n-butyl lactate, and i-butyl lactate;

aliphatic carboxylates such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate;

other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate, methyl pyruvate, and ethyl pyruvate;

aromatic hydrocarbons such as toluene and xylene; ketones such as methyl ethyl ketone, methyl n-propyl ketone, methyl n-butyl ketone, 2-heptanone, 3-heptanone, 4-heptanone, and cyclohexanone; amides such as N-methylformamide, N,N-dimethylformamide, N-methylacetamide, N,N-dimethylacetamide, and N-methylpyrrolidone; lactones such as γ-butyrolactone; and the like.

These compounds may be appropriately selectively used.

Among these, propylene glycol monomethyl ether, ethylene glycol monoethyl ether acetate, ethyl lactate, n-butyl acetate, ethyl 3-ethoxypropionate, methyl 3-methoxypropionate, 2-heptanone, cyclohexanone, γ-butyrolactone, and the like are preferable. These solvents (B) may be used either individually or in combination.

The amount of the solvent (B) is not particularly limited. It is preferable that the solvent (B) be used so that the solid content in the resist underlayer film-forming composition according to one embodiment of the invention is 0.1 to 30 mass %, for example. Note that the solid content in the resist underlayer film-forming composition according to one embodiment of the invention is more preferably 1 to 15 mass %. If the solid content in the resist underlayer film-forming composition is 0.1 to 30 mass %, the resist underlayer film-forming composition can be advantageously applied to a substrate.

Acid Generator (C)

The resist underlayer film-forming composition according to one embodiment of the invention may optionally include (C) an acid generator as long as the desired effects of the invention are not impaired.

The acid generator can prevent poisoning (i.e., an acid contained in the resist is inactivated due to diffusion of a substance (inhibitor) (e.g., a base such as $OH^-$, $CH_3^-$, or $NH_2^-$) that is generated from the substrate (particularly a low-dielectric-constant film) and inhibits a chemical reaction of the resist into the resist, so that the pattern of the positive-tone resist undergoes footing). Specifically, the acid generator contained in the resist underlayer film reacts with the inhibitor, so that diffusion of the inhibitor into the resist can be prevented.

The acid generator (C) generates an acid upon exposure or heating. Examples of the acid generator that generates an acid upon exposure (hereinafter referred to as "photoacid generator") include the compounds disclosed in paragraphs [0076] to [0081] of WO07/105,776.

Among these photoacid generators, diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, and the like are preferable. These photoacid generators may be used either individually or in combination.

Examples of the acid generator that generates an acid upon heating (hereinafter referred to as "thermal acid generator") include 2,4,4,6-tetrabromocyclohexadienone, benzoin tosylate, 2-nitrobenzyl tosylate, alkyl sulfonates, and the like.

These thermal acid generators may be used either individually or in combination. The photoacid generator and the thermal acid generator may be used in combination as the acid generator (C).

The acid generator (C) is preferably used in an amount of 100 parts by mass or less, more preferably 0.1 to 30 parts by mass, and particularly preferably 0.1 to 10 parts by mass, based on 100 parts by mass of the aromatic-containing polymer (A) that includes an alkynyloxy group. If the amount of the acid generator (C) is within the above range, the above effects can be advantageously obtained.

Crosslinking Agent (D)

The resist underlayer film-forming composition according to one embodiment of the invention may optionally include (D) a crosslinking agent as long as the desired effects of the invention are not impaired. The resist underlayer film can be cured at a low temperature by adding the crosslinking agent to the resist underlayer film-forming composition.

A polynuclear phenol or a commercially available curing agent may be used as the crosslinking agent (D). Examples of the polynuclear phenol include bisphenols such as 4,4'-biphenyldiol, 4,4'-methylenebisphenol, 4,4'-ethylidenebisphenol, and bisphenol A; trisphenols such as 4,4',4''-methylidenetrisphenol and 4,4'-[1-{4-(1-[4-hydroxyphenyl]-1-methylethyl)phenyl}ethylidene]bisphenol; polyphenols such as a novolac; and the like. Among these, 4,4'-[1-{4-(1-[4-hydroxyphenyl]-1-methylethyl)phenyl}ethylidene]bisphenol, a novolac, and the like are preferable. These polynuclear phenols may be used either individually or in combination.

Further examples of the crosslinking agent include diisocyanates such as 2,3-tolylene diisocyanate, 2,4-tolylene diisocyanate, 3,4-tolylene diisocyanate, 3,5-tolylene diisocyanate, 4,4'-diphenylmethane diisocyanate, hexamethylene diisocyanate, and 1,4-cyclohexane diisocyanate, epoxy compounds such as Epikote 812, Epikote 815, Epikote 826, Epikote 828, Epikote 834, Epikote 836, Epikote 871, Epikote 1001, Epikote 1004, Epikote 1007, Epikote 1009, Epikote 1031 (manufactured by Japan Epoxy Resins Co., Ltd.), Araldite 6600, Araldite 6700, Araldite 6800, Araldite 502, Araldite 6071, Araldite 6084, Araldite 6097, Araldite 6099 (manufactured by Ciba-Geigy), DER 331, DER 332, DER 333, DER 661, DER 644, DER 667 (manufactured by Dow Chemical Company); melamine-type curing agents such as Cymel 300, Cymel 301, Cymel 303, Cymel 350, Cymel 370, Cymel 771, Cymel 325, Cymel 327, Cymel 703, Cymel 712, Cymel 701, Cymel 272, Cymel 202, Mycoat 506, Mycoat 508 (manufactured by Nihon Cytec Industries Inc.); benzoguanamine-type curing agents such as Cymel 1123, Cymel 1123-10, Cymel 1128, Mycoat 102, Mycoat 105, Mycoat 106, Mycoat 130 (manufactured by Mitsui Cyanamid); glycoluril-type curing agents such as Cymel 1170, Cymel 1172 (manufactured by Nihon Cytec Industries Inc.), MX-279, Nikalac N-2702 (manufactured by Sanwa Chemical Co., Ltd.); and the like. Among these, melamine-type curing agents, glycoluril-type curing agents, and the like are preferable. These curing agents may be used either individually or in combination. A polynuclear phenol and a curing agent may be used in combination as the crosslinking agent (D).

The crosslinking agent (D) is preferably used in an amount of 100 parts by mass or less, more preferably 1 to 20 parts by mass, and particularly preferably 1 to 10 parts by mass, based on 100 parts by mass of the aromatic-containing polymer (A) that includes an alkynyloxy group. If the amount of the crosslinking agent (D) is within the above range, the above effects can be obtained while ensuring that the resist underlayer film exhibits the desired performance.

Additive

The resist underlayer film-forming composition according to one embodiment of the invention may optionally include additives such as a thermosetting polymer, a radiation absorber, and surfactant as long as the desired effects of the invention are not impaired.

Various thermosetting polymers may be used as the thermosetting polymer. The thermosetting polymer (E) is cured upon heating, and becomes insoluble in a solvent, so that intermixing between the resulting resist underlayer film and the resist film formed on the resist underlayer film is prevented. Examples of the thermosetting polymer (E) include acrylic polymers (thermosetting acrylic polymers), phenol polymers, urea polymers, melamine polymers, amino polymers, aromatic hydrocarbon polymers, epoxy polymers, alkyd polymers, and the like. Among these, urea polymers, melamine polymers, aromatic hydrocarbon polymers, and the like are preferable.

The thermosetting polymer is preferably used in an amount of 10 parts by mass or less, and more preferably 1 to 5 parts by mass, based on 100 parts by mass of the aromatic-containing polymer (A) that includes an alkynyloxy group.

Examples of the radiation absorber include dyes such as oil-soluble dyes, disperse dyes, basic dyes, methine dyes, pyrazole dyes, imidazole dyes, and hydroxyazo dyes; fluorescent whitening agents such as bixin derivatives, norbixin, stilbene, 4,4'-diaminostilbene derivatives, coumarin derivatives, and pyrazoline derivatives; UV absorbers such as hydroxyazo dyes, Tinuvin 234, Tinuvin 1130 (manufactured by Ciba-Geigy); aromatic compounds such as anthracene derivatives and anthraquinone derivatives; and the like. These radiation absorbers may be used either individually or in combination.

The radiation absorber is preferably used in an amount of 50 parts by mass or less, and more preferably 1 to 10 parts by mass, based on 100 parts by mass of the aromatic-containing polymer (A) that includes an alkynyloxy group.

The surfactant improves the applicability, striation, wettability, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, KP341 (manufactured by Shin-Etsu Chemical Co., Ltd.), Polyflow No. 75, Polyflow No. 95 (manufactured by Kyoeisha Chemical Co., Ltd.), FFTOP EF101, FFTOP EF204, FFTOP EF303, FFTOP EF352 (manufactured by JEMCO, Inc.), Megafac F171, Megafac F172, Megafac F173 (manufactured by DIC Corporation), Fluorad FC430, Fluorad FC431, Fluorad FC135, Fluorad FC93 (manufactured by Sumitomo 3M Ltd.), Asahi Guard AG710, Surflon S382, Surflon SC101, Surflon SC102, Surflon SC103, Surflon SC104, Surflon SC105, Surflon SC106 (manufactured by Asahi Glass Co., Ltd.), and the like. These surfactants may be used either individually or in combination.

The surfactant is preferably used in an amount of 15 parts by mass or less, and more preferably 0.001 to 10 parts by mass, based on 100 parts by mass of the aromatic-containing polymer (A) that includes an alkynyloxy group.

The resist underlayer film-forming composition may further include other additives such as a preservative, an antifoaming agent, and an adhesion improver in addition to the radiation absorber and the surfactant.

[2] Method for Forming Pattern

A method for forming a pattern according to one embodiment of the invention is described below. The method for forming a pattern according to one embodiment of the invention includes (1) a step of applying the resist underlayer film-forming composition according to one embodiment of the invention to a substrate to form a resist underlayer film, (2) a step of applying a resist composition to the substrate to form a resist film, (3) a step of exposing the resist film by selectively applying radiation to the resist film via a photomask, (4) a step of developing the exposed resist film to form a resist pattern, and (5) a step of dry-etching the resist underlayer film and the substrate using the resist pattern as a mask (etching mask) to form a pattern.

The method for forming a pattern according to one embodiment of the invention makes it possible to accurately transfer the resist pattern to the substrate with high reproducibility using the dry etching process. Each step of the method for forming a pattern according to one embodiment of the invention is described in detail below.

Step (1)

In the step (1) of the method for forming a pattern according to one embodiment of the invention, a resist underlayer film is formed on a substrate using the resist underlayer film-forming composition according to one embodiment of the invention. A substrate on which the resist underlayer film is formed can thus be obtained.

Examples of the substrate include an insulating film formed of silicon oxide, silicon nitride, silicon oxynitride, a polysiloxane, or the like, or a wafer coated with a low-dielectric-constant insulating film (e.g., Black Diamond (manufactured by AMAT), SiLK (manufactured by Dow Chemical), or Low-k film manufactured by JSR Corporation). A patterned substrate provided with a trench, a via, and the like may also be used.

The resist underlayer film-forming composition may be applied to the substrate by an arbitrary method. For example, the resist underlayer film-forming composition may be applied by spin coating or the like. Since a trench formed in the substrate can be filled with the resist underlayer film-forming composition, a given pattern can be formed on the substrate by the etching step described later.

The resist underlayer film may be formed by curing a film formed by applying the resist underlayer film-forming composition to the substrate via exposure and/or heating. Radiation used for exposure may be appropriately selected from visible rays, ultraviolet rays, deep ultraviolet rays, X-rays, electron beams, γ-rays, molecular beams, ion beams, and the like depending on the type of the photoacid generator (C) optionally included in the resist underlayer film-forming composition. A pattern may also be formed by a nanoimprint method or the like.

When heating the film formed by applying the resist underlayer film-forming composition, the heating temperature is not particularly limited, but is preferably 90 to 650° C., more preferably 90 to 450° C., and particularly preferably 90 to 350° C.

The thickness of the resist underlayer film formed by the step (1) is not particularly limited, but is preferably 10 to 1000 nm, and more preferably 30 to 500 nm.

The method for forming a pattern according to one embodiment of the invention may optionally further include (1') a step of forming an intermediate layer on the resist underlayer film after the step (1). The intermediate layer refers to a layer that is provided with a given function required to supplement the functions of the resist underlayer film or the resist film (or to provide the resist underlayer film or the resist film with a desired function) when forming a resist pattern. For example, when forming an anti-reflective film as the intermediate layer, the intermediate film can supplement the anti-reflective function of the resist underlayer film.

The intermediate layer may be formed using an organic compound or an inorganic oxide. Examples of the organic compound include DUV-42, DUV-44, ARC-28, ARC-29 (manufactured by Brewer Science), AR-3, AR-19 (manufactured by Lohm and Haas), and the like. Examples of the inorganic oxide include a spin-on-glass material manufactured by JSR Corporation, a polysiloxane formed by CVD, titanium oxide, alumina, tungsten oxide, and the like, and the like.

The intermediate layer may be formed by an arbitrary method. For example, the intermediate layer may be formed by a coating method, a CVD method, or the like. It is preferable to form the intermediate layer by a coating method. In this case, the intermediate layer can be continuously formed after forming the resist underlayer film.

The thickness of the intermediate layer may be appropriately selected depending on the function required for the intermediate layer. For example, when using a normal lithographic process, the thickness of the intermediate layer is preferably 5 to 3000 nm, and more preferably 10 to 300 nm. If the thickness of the intermediate layer is less than 5 nm, the intermediate layer may be etched away when etching the resist underlayer film. If the thickness of the intermediate layer exceeds 3000 nm, the difference in pattern dimension may increase when transferring the resist pattern to the intermediate layer.

Step (2)

In the step (2) of the method for forming a pattern according to one embodiment of the invention, a resist film is formed using a resist composition on the substrate on which the resist underlayer film is formed in the step (1). A resist film is thus formed on the resist underlayer film. When forming the intermediate layer on the resist underlayer film, the resist film is formed on the resist underlayer film and/or the intermediate layer.

Examples of a preferable resist composition used in the step (2) include a positive-tone or negative-tone chemically-amplified resist composition that includes a photoacid generator, a positive-tone resist composition that includes an alkali-soluble polymer and a quinone diazide sensitizer, a negative-tone resist composition that includes an alkali-soluble polymer and a crosslinking agent, a silicon-containing resist that includes a silicon atom as the main component, and the like.

The solid content in the resist composition is not particularly limited, but is preferably 5 to 50 mass %, for example. The resist composition may preferably be filtered through a filter having a pore size of about 0.2 μm. A commercially available resist composition may directly be used as the resist composition used for the method for forming a pattern according to one embodiment of the invention.

The resist composition may be applied by an arbitrary method. For example, the resist composition may be applied by spin coating or the like. Note that the amount of the resist composition applied is adjusted so that the resulting resist film has a given thickness.

The resist film may be formed by prebaking the film formed by applying the resist composition to volatilize the solvent (i.e., a solvent included in the resist composition) from the film. The prebaking temperature is appropriately selected depending on the type of the resist composition and the like. The prebaking temperature is preferably 30 to 200° C., and more preferably 50 to 150° C.

Step (3)

In the step (3) of the method for forming a pattern according to one embodiment of the invention, the resist film formed by the step (2) is exposed by selectively applying radiation to the resist film via a photomask.

Radiation used in the step (3) may be appropriately selected from visible rays, ultraviolet rays, deep ultraviolet rays, X-rays, electron beams, γ-rays, molecular beams, ion beams, and the like depending on the type of acid generator included in the resist composition. It is preferable to use deep ultraviolet rays, and it is particularly preferable to use KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), extreme ultraviolet rays (wavelength: 13 nm, for example), or the like. The exposure method is not particularly limited. An exposure method normally used when forming a pattern may be employed.

Step (4)

In the step (4) of the method for forming a pattern according to one embodiment of the invention, the resist film exposed in the step (3) is developed to form a resist pattern. A nanoimprint method may be used in the step (4).

A developer used for development may be appropriately selected depending on the type of the resist composition. When using a positive-tone chemically-amplified resist composition or a positive-tone resist composition that includes an alkali-soluble polymer, an aqueous solution of an alkali such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, or 1,5-diazabicyclo[4.3.0]-5-nonene may be used as the developer. An appropriate amount of an aqueous organic solvent, an alcohol (e.g., methanol or ethanol), or a surfactant may be added to the alkaline aqueous solution.

When using a negative-tone chemically-amplified resist composition or a negative-tone resist composition that includes an alkali-soluble polymer, an aqueous solution of an alkali (e.g., inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine) may be used as the developer.

In the step (4), the resist film developed using the developer may be rinsed and dried to form a given resist pattern corresponding to the photomask.

In the step (4), it is preferable to postbake the resist film before development (i.e., after exposure in the step (3)) in order to improve the resolution, the pattern profile, the developability, and the like. The postbaking temperature is appropriately selected depending on the type of the resist composition and the like. The postbaking temperature is preferably 50 to 200° C., and more preferably 80 to 150° C.

Step (5)

In the step (5) of the method for forming a pattern according to one embodiment of the invention, the resist underlayer film and the substrate are dry-etched using the resist pattern formed by the step (4) as a mask (etching mask) to form a pattern. When forming the intermediate layer on the resist underlayer film, the intermediate layer is dry-etched together with the resist underlayer film and the substrate.

The resist underlayer film and the substrate may be dry-etched using a dry etching system. As a source gas used for dry etching, an oxygen atom-containing gas (e.g., $O_2$, CO, or $CO_2$), an inert gas (e.g., He, $N_2$, or Ar), a chlorine atom-containing gas (e.g., $Cl_2$ or $BCl_4$), $H_2$, $NH_3$, or the like may be used depending on the elemental composition of the etching target film. These gases may be used in combination.

The method for forming a pattern according to one embodiment of the invention can form a given substrate-processing pattern by appropriately performing the steps (1) to (5).

EXAMPLES

The invention is further described below by way of examples. Note that the invention is not limited to the following examples. In the examples and comparative examples, the unit "parts" refers to "parts by mass", and the unit "%" refers to "mass %" unless otherwise specified.

The weight average molecular weight (Mw) and the dispersity (Mw/Mn) were measured by gel permeation chromatography (detector: differential refractometer) using GPC columns manufactured by Tosoh Corporation (G2000HXL×2, G3000HXL×1) at a flow rate of 1.0 ml/min and a column temperature of 40° C. (eluant: tetrahydrofuran, standard: monodisperse polystyrene).

Synthesis Example 1

Production of Polymer (A1-1)

(1) Synthesis of Condensate

A separable flask equipped with a thermometer was charged with 10 parts by mass of 1-naphthol, 5 parts by mass of formaldehyde, 1 part by mass of p-toluenesulfonic acid, and 30 parts by mass of methyl isobutyl ketone. The mixture was reacted at 50° C. for 5 hours with stirring to obtain a 1-naphthol/formaldehyde condensate. The condensate had an Mw of 890 and a dispersity (Mw/Mn) of 1.4.

(2) Introduction of Specific Substituent

A separable flask equipped with a thermometer was charged with 50 parts by mass of the resulting condensate (A1), 100 parts by mass of propargyl bromide, 90 parts by mass of diazabicycloundecene, and 2000 parts by mass of N-methylpyrrolidone. The mixture was reacted at 45° C. for 8 hours. After completion of the reaction, the reaction solution was cooled with water to 30° C. or less. The polymer solution was then added to a large quantity of n-heptane. A solid that precipitated by this operation was separated by decantation, and washed with a large quantity of n-heptane. The solid was then dissolved in methyl isobutyl ketone, and washed with oxalic acid (1 wt %) and purified water to remove the remaining base component. The organic layer was dried at 50° C. for 17 hours to obtain a polymer (A1-1) having an Mw of 2000 and a dispersity (Mw/Mn) of 1.6.

Synthesis Examples 2 to 28

Polymers (A1-2) to (A2-14)

A condensate was obtained in the same manner as in the step (1) of Synthesis Example 1, except for appropriately changing the reaction time and the reaction temperature. The Mw and the dispersity (Mw/Mn) of the resulting condensate are shown in Table 2 (see "Condensate"). The structures of the condensates A1 and A2 in Table 2 are shown in Table 1. The specific substituent was introduced into the resulting condensate, and the resulting product was washed and dried in the same manner as in the step (2) of Synthesis Example 1 to obtain polymers (A1-2) to (A2-14). The Mw and the dispersity (Mw/Mn) of each polymer are shown in Table 2 (see "Specific polymer").

TABLE 1

| | |
|---|---|
| A1 | 1-Naphthol/formaldehyde condensate (polymer including repeating unit shown by the following formula [A-1]) |
| A2 | 2,7-Naphthalenediol/formaldehyde condensate (polymer including repeating unit shown by the following formula [A-2]) |

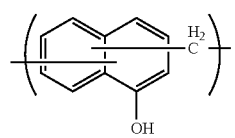

[A-1]

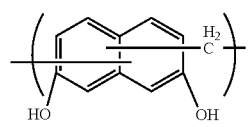

[A-2]

TABLE 2

| | Condensate | | Specific polymer | | |
|---|---|---|---|---|---|
| | Type | Molecular weight (×10³) | Mw/Mn | Type | Molecular weight (×10³) | Mw/Mn |
| Synthesis Example 1 | A1 | 0.9 | 1.4 | A1-1 | 2.0 | 1.6 |
| Synthesis Example 2 | A1 | 1.3 | 1.4 | A1-2 | 3.0 | 1.6 |
| Synthesis Example 3 | A1 | 1.3 | 1.2 | A1-3 | 3.0 | 1.3 |
| Synthesis Example 4 | A1 | 1.3 | 2.7 | A1-4 | 3.0 | 3.0 |
| Synthesis Example 5 | A1 | 1.3 | 4.8 | A1-5 | 3.0 | 5.2 |
| Synthesis Example 6 | A1 | 2.2 | 1.4 | A1-6 | 5.0 | 1.6 |
| Synthesis Example 7 | A1 | 2.2 | 1.2 | A1-7 | 5.0 | 1.3 |
| Synthesis Example 8 | A1 | 2.2 | 2.7 | A1-8 | 5.0 | 3.0 |
| Synthesis Example 9 | A1 | 2.2 | 4.8 | A1-9 | 5.0 | 5.2 |
| Synthesis Example 10 | A1 | 4.4 | 1.4 | A1-10 | 10 | 1.6 |
| Synthesis Example 11 | A1 | 4.4 | 1.2 | A1-11 | 10 | 1.3 |
| Synthesis Example 12 | A1 | 4.4 | 2.7 | A1-12 | 10 | 3.0 |
| Synthesis Example 13 | A1 | 4.4 | 3.9 | A1-13 | 10 | 5.2 |
| Synthesis Example 14 | A1 | 5.4 | 1.3 | A1-14 | 12 | 1.6 |
| Synthesis Example 15 | A2 | 0.9 | 1.5 | A2-1 | 2.0 | 1.6 |
| Synthesis Example 16 | A2 | 1.2 | 1.4 | A2-2 | 3.0 | 1.6 |
| Synthesis Example 17 | A2 | 1.2 | 1.2 | A2-3 | 3.0 | 1.3 |
| Synthesis Example 18 | A2 | 1.2 | 2.8 | A2-4 | 3.0 | 3.0 |
| Synthesis Example 19 | A2 | 1.2 | 4.8 | A2-5 | 3.0 | 5.2 |
| Synthesis Example 20 | A2 | 2.1 | 1.4 | A2-6 | 5.0 | 1.6 |
| Synthesis Example 21 | A2 | 2.1 | 1.2 | A2-7 | 5.0 | 1.3 |
| Synthesis Example 22 | A2 | 2.1 | 2.8 | A2-8 | 5.0 | 3.0 |
| Synthesis Example 23 | A2 | 2.1 | 4.8 | A2-9 | 5.0 | 5.2 |
| Synthesis Example 24 | A2 | 4.3 | 1.4 | A2-10 | 10 | 1.6 |
| Synthesis Example 25 | A2 | 4.3 | 1.2 | A2-11 | 10 | 1.3 |
| Synthesis Example 26 | A2 | 4.3 | 2.8 | A2-12 | 10 | 3.0 |
| Synthesis Example 27 | A2 | 4.3 | 3.9 | A2-13 | 10 | 5.2 |
| Synthesis Example 28 | A2 | 5.5 | 1.4 | A2-14 | 12 | 1.6 |

Production of Resist Underlayer Film-Forming Composition

Example 1

10 parts by mass of the polymer (A1-1) was dissolved in 90 parts by mass of propylene glycol monomethyl acetate. The solution was filtered through a membrane filter having a pore size of 0.1 μm to obtain a resist underlayer film-forming composition.

Examples 2 to 28

A resist underlayer film-forming composition was obtained in the same manner as in Example 1, except for using the polymer shown in Table 3 instead of the polymer (A1-1).

Example 29

10 parts by mass of the polymer (A1-1) was dissolved in 90 parts by mass of propylene glycol monomethyl acetate. The solution was filtered through a membrane filter having a pore size of 0.1 μm to obtain a resist underlayer film-forming composition.

Examples 30 to 32

A resist underlayer film-forming composition was obtained in the same manner as in Example 29, except for changing the type or the amount of each component as shown in Table 3. Note that the item "Acid generator" shown in Table 3 refers to bis(4-t-butylphenyl)iodonium nonafluoro-n-butanesulfonate, and the item "Crosslinking agent" shown in Table 3 refers to the compound shown by the following formula.

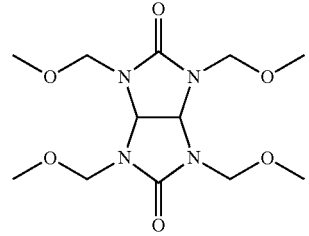

Evaluation of Performance of Resist Underlayer Film

The capability of filling a depression formed in a substrate with the resist underlayer film and the amount of sublimation (sublimates) were evaluated using the resist underlayer film-forming composition. The results are shown in Table 3.

[Filling Capability]

The filling capability was evaluated by determining whether or not a via-hole is sufficiently filled with the resist underlayer film-forming composition. The filling capability was evaluated by the following method. The resist underlayer film-forming composition was spin-coated onto a tetraethylorthosilicate (TEOS) substrate 1 or 2 (see below). The resist underlayer film-forming composition was heated at 250° C. for 60 seconds on a hot plate. A resist underlayer film having a thickness of 300 nm was thus formed inside the via-hole and on the surface of the substrate. The filling state of ten randomly selected via-holes formed in each of the substrates 1 and 2 was observed using a scanning electron microscope to evaluate the resist underlayer film in accordance with the following standard.

AA: The resist underlayer film was formed inside all of the observed via-holes formed in each of the substrates 1 and 2.

A: The resist underlayer film was formed inside all of the observed via-holes formed in the substrate 2, but was not formed inside all of the observed via-holes formed in the substrate 1.

B: The resist underlayer film was not formed inside all of the observed via-holes formed in each of the substrates 1 and 2.

<Substrate 1>

Tetraethylorthosilicate (TEOS) substrate in which via-holes having a size of 140 nm and a depth of 1000 nm were formed at a pitch of 1H/1.2S <Substrate 2>

Tetraethylorthosilicate (TEOS) substrate in which via-holes having a size of 140 nm and a depth of 500 nm were formed at a pitch of 1H/1.2S

[Amount of Sublimates]

The resist underlayer film-forming composition was spin-coated onto an 8-inch silicon wafer. The resist underlayer film-forming composition was heated at 180° C. for 60 seconds, and then heated at 250° C. for 60 seconds on a hot plate to form a resist underlayer film having a thickness of 300 nm. The amount of sublimates was measured during this process. An 8-inch silicon wafer was attached to the top plate of the hot plate, and the weight of sublimates deposited on the 8-inch silicon wafer was measured after applying the resist underlayer film-forming composition 100 times. A case where the amount of sublimates was 1.5 mg or less was evaluated as "AA", a case where the amount of sublimates was more than 1.5 mg and 2.5 mg or less was evaluated as "A", and a case where the amount of sublimates was more than 2.5 mg was evaluated as "B".

TABLE 3

|  | Resin (A) | | Acid generator | Cross-linking agent | Filling capability | Sublimation |
|---|---|---|---|---|---|---|
|  | Type | Parts | | | | |
| Example 1 | A1-1 | 10 | | | AA | B |
| Example 2 | A1-2 | 10 | | | AA | AA |
| Example 3 | A1-3 | 10 | | | A | AA |
| Example 4 | A1-4 | 10 | | | AA | AA |
| Example 5 | A1-5 | 10 | | | AA | A |
| Example 6 | A1-6 | 10 | | | AA | AA |
| Example 7 | A1-7 | 10 | | | A | AA |
| Example 8 | A1-8 | 10 | | | AA | AA |
| Example 9 | A1-9 | 10 | | | AA | A |
| Example 10 | A1-10 | 10 | | | AA | AA |
| Example 11 | A1-11 | 10 | | | A | AA |
| Example 12 | A1-12 | 10 | | | AA | AA |
| Example 13 | A1-13 | 10 | | | AA | A |
| Example 14 | A1-14 | 10 | | | B | AA |
| Example 15 | A2-1 | 10 | | | AA | B |
| Example 16 | A2-2 | 10 | | | AA | AA |
| Example 17 | A2-3 | 10 | | | A | AA |
| Example 18 | A2-4 | 10 | | | AA | AA |
| Example 19 | A2-5 | 10 | | | AA | A |
| Example 20 | A2-6 | 10 | | | AA | AA |
| Example 21 | A2-7 | 10 | | | A | AA |
| Example 22 | A2-8 | 10 | | | AA | AA |
| Example 23 | A2-9 | 10 | | | AA | A |
| Example 24 | A2-10 | 10 | | | AA | AA |
| Example 25 | A2-11 | 10 | | | A | AA |
| Example 26 | A2-12 | 10 | | | AA | AA |
| Example 27 | A2-13 | 10 | | | AA | A |
| Example 28 | A2-14 | 10 | | | B | AA |
| Example 29 | A1-3 | 10 | 0.5 | 1 | AA | AA |
| Example 30 | A1-3 | 10 | 0.5 | 0.5 | AA | AA |
| Example 31 | A2-6 | 10 | 0.5 | 1 | AA | AA |
| Example 32 | A2-6 | 10 | 0.5 | 0.5 | AA | AA |

As is clear from Table 3, an excellent filling capability was obtained, and sublimation was suppressed in Examples 2 to 13, 16 to 27, and 29 to 32 in which the resist underlayer film-forming composition according to the embodiments of the invention was used. In Examples 2, 4, 6, 8, 10, 12, 16, 18, 20, 22, 24, 26, and 29 to 32 in which the polymer had a preferable dispersity (Mw/Mn), an improvement in filling capability and suppression of sublimation were achieved in a more well-balanced manner.

Obviously, numerous modifications and variations of the invention are possible in light of the above teachings. It is therefore to be understood that within the scope of the appended claims, the invention may be practiced otherwise than as specifically described herein.

What is claimed is:

1. A resist underlayer film-forming composition comprising:

a polymer including a repeating unit shown by a formula (1), having a dispersity of from 1.4 to 5.0, polystyrene-reduced weight average molecular weight of from 3000 to 10,000; and a solvent,

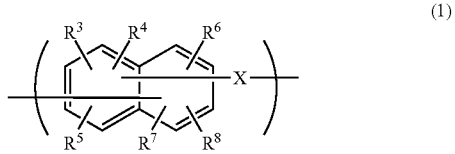

(1)

wherein
each of $R^3$ to $R^8$ individually represent a group shown by a formula (2), a hydrogen atom, a hydroxyl group, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, a substituted or unsubstituted aryl group having 6 to 14 carbon atoms, or a substituted or unsubstituted glycidyl ether group having 2 to 6 carbon atoms, wherein at least one of $R^3$ to $R^8$ represents the group shown by the formula (2), and X represents a substituted or unsubstituted alkanediyl group having 1 to 10 carbon atoms, a substituted or unsubstituted cycloalkanediyl group having 3 to 20 carbon atoms, a substituted or unsubstituted alkanediyloxy group having 1 to 10 carbon atoms, a substituted or unsubstituted cycloalkanediyloxy group having 3 to 20 carbon atoms, a substituted or unsubstituted arylene group having 6 to 14 carbon atoms, or a divalent group formed by an arbitrary combination thereof,

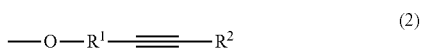

(2)

wherein
$R^1$ represents a single bond, a substituted or unsubstituted alkanediyl group having 1 to 20 carbon atoms, or a substituted or unsubstituted arylene group having 6 to 20 carbon atoms, and $R^2$ represents a hydrogen atom, a substituted or unsubstituted alkyl group having 1 to 20 carbon atoms, or a substituted or unsubstituted aryl group having 6 to 20 carbon atoms.

2. The resist underlayer film-forming composition according to claim 1, further comprising an acid generator.

3. The resist underlayer film-forming composition according to claim 1, further comprising a crosslinking agent.

\* \* \* \* \*

UNITED STATES PATENT AND TRADEMARK OFFICE
CERTIFICATE OF CORRECTION

PATENT NO. : 8,859,185 B2  
APPLICATION NO. : 13/948107  
DATED : October 14, 2014  
INVENTOR(S) : Shin-ya Minegishi et al.

Page 1 of 1

It is certified that error appears in the above-identified patent and that said Letters Patent is hereby corrected as shown below:

In the Specification,

Column 4, Line 14, "-$R^{S2}$-CO-$R^{S1}$, $R^{S2}$-O-CO-$R^{S1}$" should read
-- -$R^{S2}$-CO-$R^{S1}$, -$R^{S2}$-CO-O$R^{S1}$, -$R^{S2}$-O-CO-$R^{S1}$ --.

In the Claims,

Column 20, Line 19 (Claim 1), "1.4 to 5.0, polystyrene-reduced" should read -- 1.4 to 5.0, and having a polystyrene-reduced --.

Signed and Sealed this  
Twenty-fourth Day of March, 2015

Michelle K. Lee  
*Director of the United States Patent and Trademark Office*